United States Patent
Kholodenko et al.

(10) Patent No.: US 9,905,402 B2
(45) Date of Patent: *Feb. 27, 2018

(54) PLASMA PROCESSING CHAMBER WITH A GROUNDED ELECTRODE ASSEMBLY

(71) Applicant: Lam Research Corporation, Fremont, CA (US)

(72) Inventors: Arnold Kholodenko, San Francisco, CA (US); Anwar Husain, Pleasanton, CA (US)

(73) Assignee: Lam Research Corporation, Fremont, CA (US)

( * ) Notice: Subject to any disclaimer, the term of this patent is extended or adjusted under 35 U.S.C. 154(b) by 376 days.

This patent is subject to a terminal disclaimer.

(21) Appl. No.: 14/807,883

(22) Filed: Jul. 24, 2015

(65) Prior Publication Data

US 2015/0325416 A1 Nov. 12, 2015

Related U.S. Application Data

(63) Continuation of application No. 12/825,268, filed on Jun. 28, 2010, now Pat. No. 9,111,968, which is a (Continued)

(51) Int. Cl.
*C23C 16/00* (2006.01)
*H01J 37/32* (2006.01)
*H01L 21/67* (2006.01)

(52) U.S. Cl.
CPC .. *H01J 37/32532* (2013.01); *H01J 37/32055* (2013.01); *H01J 37/32082* (2013.01); *H01J 37/32091* (2013.01); *H01J 37/32174* (2013.01); *H01J 37/32458* (2013.01); *H01J 37/32559* (2013.01); *H01J 37/32577* (2013.01); *H01J 37/32651* (2013.01); *H01J 37/32724* (2013.01); *H01L 21/67069* (2013.01)

(58) Field of Classification Search
CPC .................................................. H01L 21/67069
USPC ........................................................ 118/723 E
See application file for complete search history.

(56) References Cited

U.S. PATENT DOCUMENTS

| | | | | |
|---|---|---|---|---|
| 5,445,709 A * | 8/1995 | Kojima | ............. | H01J 37/32009 156/345.37 |
| 6,786,175 B2 * | 9/2004 | Dhindsa | ............ | C23C 16/45565 118/723 E |

(Continued)

*Primary Examiner* — Keath Chen
(74) *Attorney, Agent, or Firm* — Martine Penilla Group, LLP

(57) ABSTRACT

An optimized plasma processing chamber configured to provide a current path is provided. The optimized plasma processing chamber includes at least an upper electrode, a powered lower electrode, a heating plate, a cooling plate, a plasma chamber lid, and clamp ring. Both the heating plate and the cooling plate are disposed above the upper electrode whereas the heating plate is configured to heat the upper electrode while the cooling plate is configured to cool the upper electrode. The clamp ring is configured to secure the upper electrode to a plasma chamber lid and to provide a current path from the upper electrode to the plasma chamber lid. A pocket may be formed between the clamp ring and the upper electrode to hold at least the heater plate, wherein the pocket is configured to allow longitudinal and lateral tolerances for thermal expansion of the heater plate from repetitive thermal cycling.

18 Claims, 8 Drawing Sheets

Related U.S. Application Data continuation of application No. 11/316,054, filed on Dec. 21, 2005, now Pat. No. 7,743,730.

(56) References Cited

U.S. PATENT DOCUMENTS

| | | | | |
|---|---|---|---|---|
| 7,159,537 B2* | 1/2007 | Wickramanayaka | H01J 37/3244 | 118/715 |
| 2001/0030024 A1* | 10/2001 | Sago | H01J 37/3244 | 156/345.51 |
| 2005/0133160 A1* | 6/2005 | Kennedy | C23C 16/45565 | 156/345.34 |
| 2006/0011298 A1* | 1/2006 | Lim | C23C 16/45514 | 156/345.34 |
| 2006/0100825 A1* | 5/2006 | Furuya | H01L 21/67288 | 702/185 |

\* cited by examiner

PLASMA PROCESSING CHAMBER WITH A GROUNDED ELECTRODE ASSEMBLY

CLAIM OF PRIORITY

This is a Continuation of U.S. patent application Ser. No. 12/825,268, filed on Jun. 28, 2010, entitled "Plasma Processing Chamber With a Grounded Electrode Assembly," which is a Continuation of U.S. patent application Ser. No. 11/316,054, filed on Dec. 21, 2005, entitled "Apparatus For An Optimized Plasma Chamber Grounded Electrode Assembly," now U.S. Pat. No. 7,743,730, all of which are incorporated herein by reference.

BACKGROUND OF THE INVENTION

The present invention relates in general to substrate manufacturing technologies and in particular to an apparatus for an optimized plasma chamber electrode assembly.

In the processing of a substrate, e.g., a semiconductor substrate or a glass panel such as one used in flat panel display manufacturing, plasma is often employed. As part of the processing of a substrate for example, the substrate is divided into a plurality of dies, or rectangular areas, each of which will become an integrated circuit. The substrate is then processed in a series of steps in which materials are selectively removed (etching) and deposited. Control of the transistor gate critical dimension (CD) on the order of a few nanometers is a top priority, as each nanometer deviation from the target gate length may translate directly into operational speed and or operability of these devices.

In an exemplary plasma process, a substrate is coated with a thin film of hardened emulsion (such as a photoresist mask) prior to etching. Areas of the hardened emulsion are then selectively removed, causing parts of the underlying layer to become exposed. The substrate is then placed in a plasma processing chamber on a substrate support structure called a chuck (e.g., mono-polar, bi-polar electrode, mechanical, etc.). An appropriate set of plasma gases is then flowed into the chamber and struck to form a plasma to etch exposed areas of the substrate with a particular topography.

Referring now to FIG. 1, a simplified diagram of a capacitive coupled plasma processing system is shown. In general, a plasma is sustained between a grounded electrode 106 and a powered lower electrode (chuck) 105. A first RF generator 134 generates the plasma as well as controls the plasma density, while a second RF generator 138 generates bias RF, commonly used to control the DC bias and the ion bombardment energy.

Further coupled to source RF generator 134 and bias RF generator 138 is matching network 136 that attempts to match the impedances of the RF power sources to that of plasma 110. Furthermore, pump 111 is commonly used to evacuate the ambient atmosphere from plasma chamber 102 in order to achieve the required pressure to sustain plasma 110. In addition, plasma 110 may be confined between chuck 105 and grounded electrode 106 by means of confinement rings 103, which may control a pressure within plasma 110. Confinement rings 103 can be moved to increase and decrease a spacing or gap between adjacent confinement rings, commonly by the use of cam ring. Gas distribution system 122 is commonly comprised of compressed gas cylinders containing plasma processing gases (e.g., $C_4F_8$, $C_4F_6$, $CHF_3$, $CH_2F_3$, $CF_4$, $HBr$, $CH_3F$, $C_2F_4$, $N_2$, $O_2$, $Ar$, $Xe$, $He$, $H_2$, $NH_3$, $SF_6$, $BCl_3$, $Cl_2$, $WF_6$, etc).

In general, in order to achieve a substantially uniform enchant gas distribution across the surface of a substrate, the grounded electrode typically includes perforations or pores, in a showerhead configuration, through which the plasma gases may pass into the plasma chamber. In a common configuration, an electrode assembly usually includes the chamber lid (in order to securely attach the electrode components in the plasma chamber), a cooling plate and a heating plate (in order to prevent plasma gas reactions from taking place within the perforations or pores), a backing plate (in order to electrically isolate the electrode from the heating plate and cooling plate, while still allowing a thermal path between the heating plate and cooling plate and the grounded electrode), and the grounded electrode itself (in order to distribute the plasma gas across the surface of the substrate, as well as to provide a RF return ground path for the powered electrode).

Referring now to FIG. 2, a simplified diagram of a common electrode assembly configuration is shown. Chamber lid 212 is generally configured to mate with the plasma chamber in order to maintain a substantial vacuum for plasma processing. In general, chamber lid 212 comprises a top plate 212b and circular stub 212a that protrudes into the plasma chamber (not shown) and provides a planar surface to which a cooling plate 208 or heating plate 206 may be attached. Circular stub 212a is further surrounded by a groove (defined by circular stub 212a and top plate 212b) into which gasket 214 are commonly placed. In one configuration, an electrode sub-assembly (including in sequence a cooling plate 208, a heating plate 206, a backing plate 204, and grounded electrode 202) is assembled or sandwiched in a unitary construction, with a first set of metal fasteners, and then attached as a unit to circular stub 212a with a second set of metal fasteners, in order to assemble the electrode assembly.

Cooling plate 208 may be cooled by a chiller system that re-circulates fluid through cavities in within cooling plate 208. In addition, the fluid can be a liquid (e.g., water, etc.) or a gas (e.g., air, etc.). The liquid or air can be chilled for greater cooling effect and can be re-circulated for greater efficiency. This fluid is, in turn, commonly pumped through a set of conduits to an external source of heat convection, such as a heat exchanger, and returned back to the chuck. Heating plate 206 generally includes a set of resistive elements that output thermal energy to when the set of elements is supplied with electrical current. In combination with cooling plate 208, heating plate 206 allows the plasma gas temperature to be sustained within recipe parameters in order to generally maintain etch quality and substrate yield. Backing plate 204 is commonly made of graphite, backing plate generally provides temperature uniformity across grounded electrode 202.

However, backing plate 204 is generally made of a material that is relatively soft (e.g., graphite, etc.). Consequently, helicoil inserts are often required in order to properly mate with threaded metal fasteners. A helicoil is generally an internal thread insert for creating stronger threads in any assembly prone to thread damage. However, the use of different materials with differing thermal expansion rates may cause defects to form in the electrode assembly as it is repeatedly heated and cooled. The coefficient of thermal expansion ($\alpha$) is generally defined as the fractional increase in length per unit rise in temperature. The exact definition varies, depending on whether it is specified at a precise temperature (true $\alpha$) or over a temperature ranges (mean $\alpha$). The former may be related to the slope of the tangent to the length-temperature plot, while the latter may be governed by the slope of the chord between two points on this curve.

In general, the metal portions of the electrode assembly (e.g., cooling plate 208, heater plate 206, threaded bolts, etc.) generally have a higher than the non-metal portions of the electrode assembly (e.g., backing plate, etc.). For example, aluminum (commonly used in cooling plate 208, heating plate 206, grounded electrode 202, metal fasteners, etc.) generally has a relatively large $\alpha$ (e.g., 23.1.times.10$^{-6}$ K$^{-1}$), in comparison to graphite (commonly used in backing plate 204) with a smaller a (e.g., 6.5×10$^{-6}$ K$^{-1}$). That is, per a unit increase in temperature, aluminum may expand up to four times as much as graphite. However, the electrode assembly is assembled in a unitary construction with metal fasteners that extend through the various components (e.g., cooling plate, heater plate, backing plate, grounded electrode, etc.), and thus has minimal lateral and longitudinal play between the components. Consequently, repetitive cycling of temperature may stress and hence damage the backing plate 204, and consequently produce graphite particles that may contaminate the plasma chamber. In general, the lateral axis is parallel to the substrate surface, whereas the longitudinal axis is perpendicular to the substrate surface.

In addition, the use of metal fasteners in the electrode sub-assembly may also increase the likelihood of arcing. An arc is generally a high power density short circuit which has the effect of a miniature explosion. When arcs occur on or near the surfaces of the target material or chamber fixtures, substantial damage can occur, such as local melting. Plasma arcs are generally caused by low plasma impedance which results in a steadily increasing current flow. If the resistance is low enough, the current will increase indefinitely (limited only by the power supply and impedance), creating a short circuit in which all energy transfer takes place. This may result in damage to the substrate as well as the plasma chamber. For example, as the RF electrical charge is drained away from the powered electrode toward the grounded electrode, a secondary electrical discharge may occur with a metal fastener, particularly across a perforation or pore.

Furthermore, the large number of metal fasteners also makes assembling, aligning, replacing, and/or installing the electrode sub-assembly components problematic. For example, fastener tolerances may be relatively tight (e.g. $\frac{1}{1000}^{th}$ inch, etc.). However, after the electrode assembly has been repeatedly exposed to plasma and/or temperature cycling, the actual tolerance may have been reduced (tolerance shrinkage). For example, contaminants may have wedged themselves into the helicoil, or the fastener holes may have decreased in size, etc. Consequently, the electrode assembly may be difficult to remove in a safe manner, without damage occurring to the electrode assembly itself, and without the use of multiple tools (e.g., screwdriver, hammer, wedge, etc.). For example, graphite is a relatively brittle material. However, if a hammer needs to be used to dislodge the cooling plate or heating plate from the backing plate, substantial damage may occur to the graphite.

In addition, since most common electrode assembly configurations do not generally include a dedicated RF return path, the electrical characteristics of ground may change between successive substrates or alternate recipes, depending on electrode assembly wear, or the electrical characteristics of the plasma gases used. Generally, most materials used in the electrode assembly are electrically conductive. However, the exact return path to ground may physically shift, and hence may affect the electrical load on the plasma. For a given process recipe, it is generally beneficial for the RF power delivery to remain stable throughout the plasma process in order to obtain a reliable process result.

In view of the foregoing, there are desired methods and apparatus for an optimized plasma chamber electrode assembly.

SUMMARY OF THE INVENTION

The invention relates, in one embodiment, to an electrode assembly configured to provide a ground path for a plasma processing chamber of a plasma processing system. The apparatus includes an electrode configured to be exposed to a plasma. The apparatus also includes a heater plate disposed above the electrode, wherein the heater plate is configured to heat the electrode. The apparatus further includes a cooling plate disposed above the heater plate, wherein the cooling plate is configured to cool the electrode. The apparatus also includes a plasma chamber lid configured to confine the plasma in the plasma chamber, wherein the plasma chamber lid includes a ground. The apparatus further includes a clamp ring configured to secure the electrode, the heater plate, and the cooling plate to the plasma chamber lid, the clamp ring is further configured to provide the ground path from the electrode to the chamber lid.

The invention relates, in one embodiment, to an electrode assembly configured to provide a ground path for a plasma processing chamber of a plasma processing system. The apparatus includes an electrode configured to be exposed to a plasma. The apparatus also includes a plasma chamber lid configured to confine the plasma in the plasma chamber, wherein the plasma chamber lid includes a ground. The apparatus further includes a clamp ring configured to secure the electrode to the plasma chamber lid; the clamp ring is further configured to provide the ground path from the electrode to the chamber lid.

The invention relates, in one embodiment, to an electrode assembly configured to provide a ground path for a plasma processing chamber of a plasma processing system. The apparatus includes an electrode configured to be exposed to a plasma. The apparatus also includes a plasma chamber lid configured to confine the plasma in the plasma chamber, wherein the plasma chamber lid is configured to form a basket with the electrode and is further configured provide a ground path.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

Figure 1:
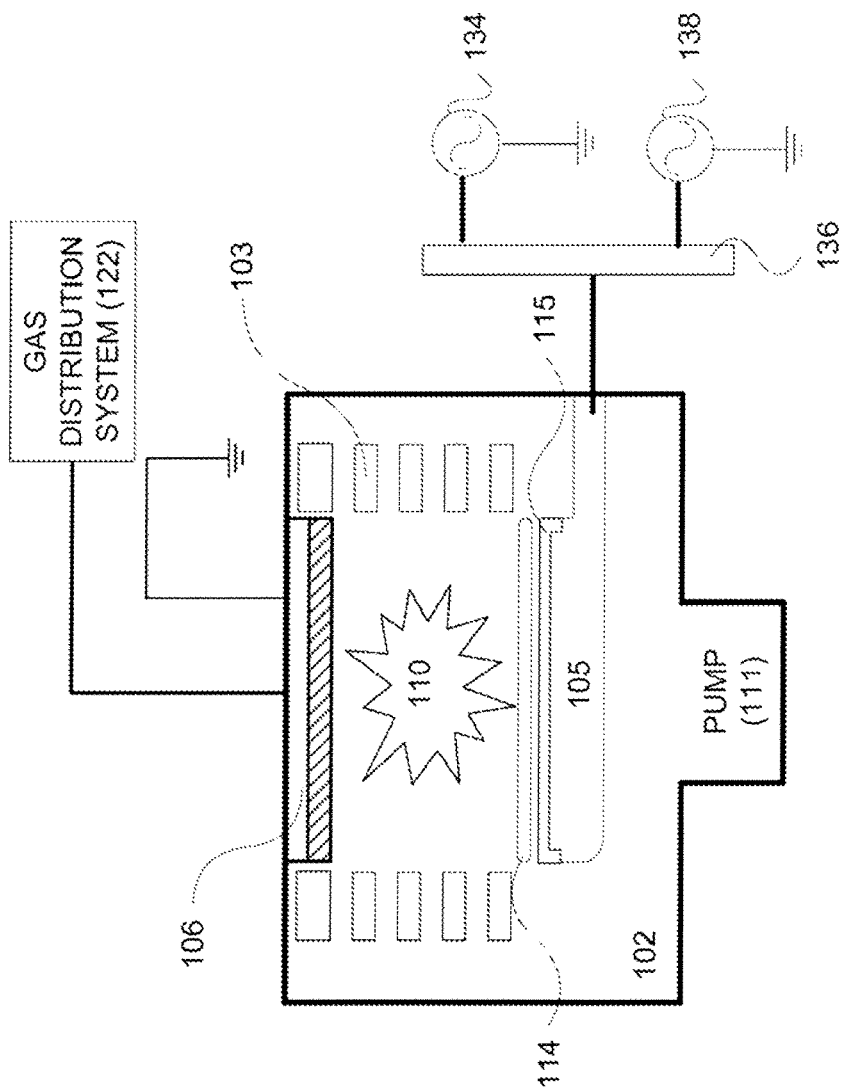
FIG. 1 shows a simplified diagram of a capacitive coupled plasma processing system.
Figure 2:
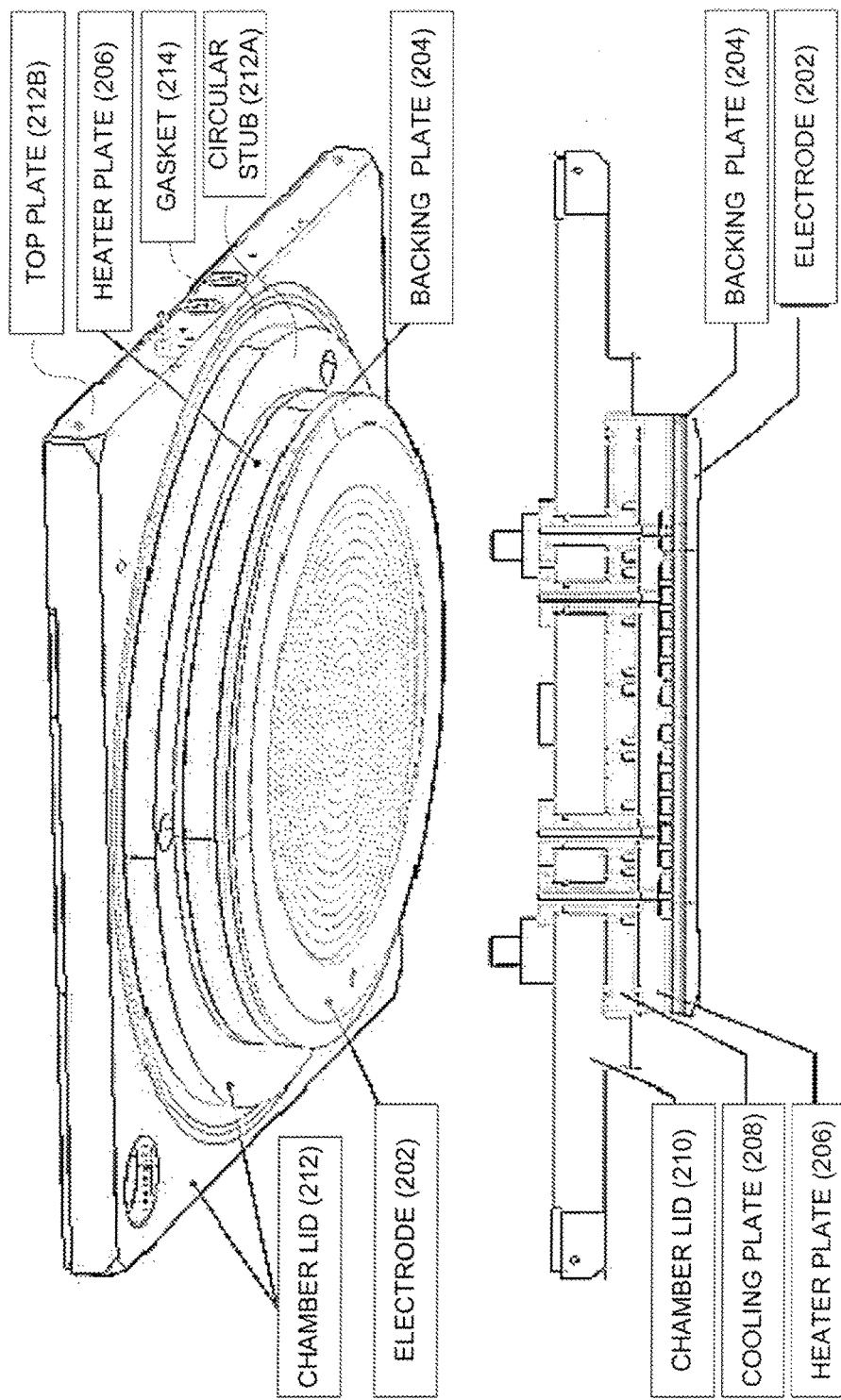
FIG. 2 shows a simplified diagram of a commonly used electrode assembly.

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

While not wishing to be bound by theory, it is believed by the inventor herein that an optimized electrode assembly (e.g., electrode, cooling plate, heater plate, backing plate, etc.) configured with a clamp ring may provide a consistent RF return path, may be simpler and less time consuming to install and remove in a plasma chamber, and may substantially reduce particle generation caused by thermal expansion. In the discussions that follow, the term "tighten" is employed herein to discuss moving a fastener into a securing structure. Furthermore, the term fastener should be understood to apply to a broad range of securing devices such as such as screws, bolts, clips, and pins.

As previously discussed, in order to achieve a substantially uniform enchant gas distribution across the surface of a substrate, an electrode assembly (e.g., powered electrode, grounded electrode, etc.) generally has perforations or pores (e.g., showerhead). The use of different materials with differing expansion rates may consequently cause defects to form in the electrode assembly as it is repeatedly heated and cooled. However, in an advantageous manner, the current invention allows the electrode sub-assembly components (e.g., cooling plate, heater plate, backing plate, electrode, etc.) to be positioned in a pocket formed by a clamp ring without requiring the use of metal fasteners. This pocket construction may allow a greater amount lateral and longitudinal play than in most commonly used configurations, and hence produce less contaminants. That is, repetitive cycling of temperature may produce substantially less stress and hence less damage to the backing plate, and thus minimize the amount of contaminants (e.g., graphite particles, etc.) that are produced. For example, in an embodiment, a lateral tolerance of 1 mm, between electrode assembly components and the inner surface of the clamp ring, may be sufficient to reduce stress. In an embodiment, a longitudinal tolerance of 1 mm, between electrode assembly components and the lateral surface of the electrode away from the plasma, may be sufficient to reduce stress.

In an embodiment, the clamp ring, including the electrode sub-assembly components positioned in the pocket, may be secured to the chamber lid. In general, securing the clamp ring to the chamber lid compresses the electrode sub-assembly components together for plasma chamber operation. In addition, the clamp ring may be secured to the chamber lid with a set of fasteners that are sufficiently tightened or torqued to compress the electrode sub-assembly components together. In an embodiment, the fasteners are counter sunk or rounded off in order to reduce arcing, if desired. In an embodiment, the clamp ring is secured to the chamber lid with a set of non-metal fasteners (e.g., ceramic, etc.). In an embodiment, the clamp ring itself is formed into the chamber lid, and hence does not also require metal fasteners. In an embodiment, clamp ring/chamber lid may be tiered or stepped to secure electrode sub-assembly components.

Furthermore, as the number of fasteners that previously sandwiched the electrode subassembly (e.g., cooling plate, heating plate, backing plate, electrode, etc.) is substantially reduced or eliminated, the likelihood of arcing may also be reduced. That is, these fasteners may no longer positioned near the pores or perforations of the electrode where arcing may be likely. Clamp ring fasteners, in contrast, tend less likely to arc, since they are generally positioned away from the pores or perforations of the electrode, and instead on the ground path. As previously described, an arc is generally a high power density short circuit which has the effect of a miniature explosion that may result in damage to the substrate as well as the plasma chamber. Substantially reducing the number of metal fasteners may also reduce the likelihood that a secondary electrical discharge would occur as the RF electrical charge is drained away. Furthermore, a dedicated return path may also insure that the electrical characteristics of ground remain consistent between consecutive substrates or alternate plasma recipes.

Figure 3A:
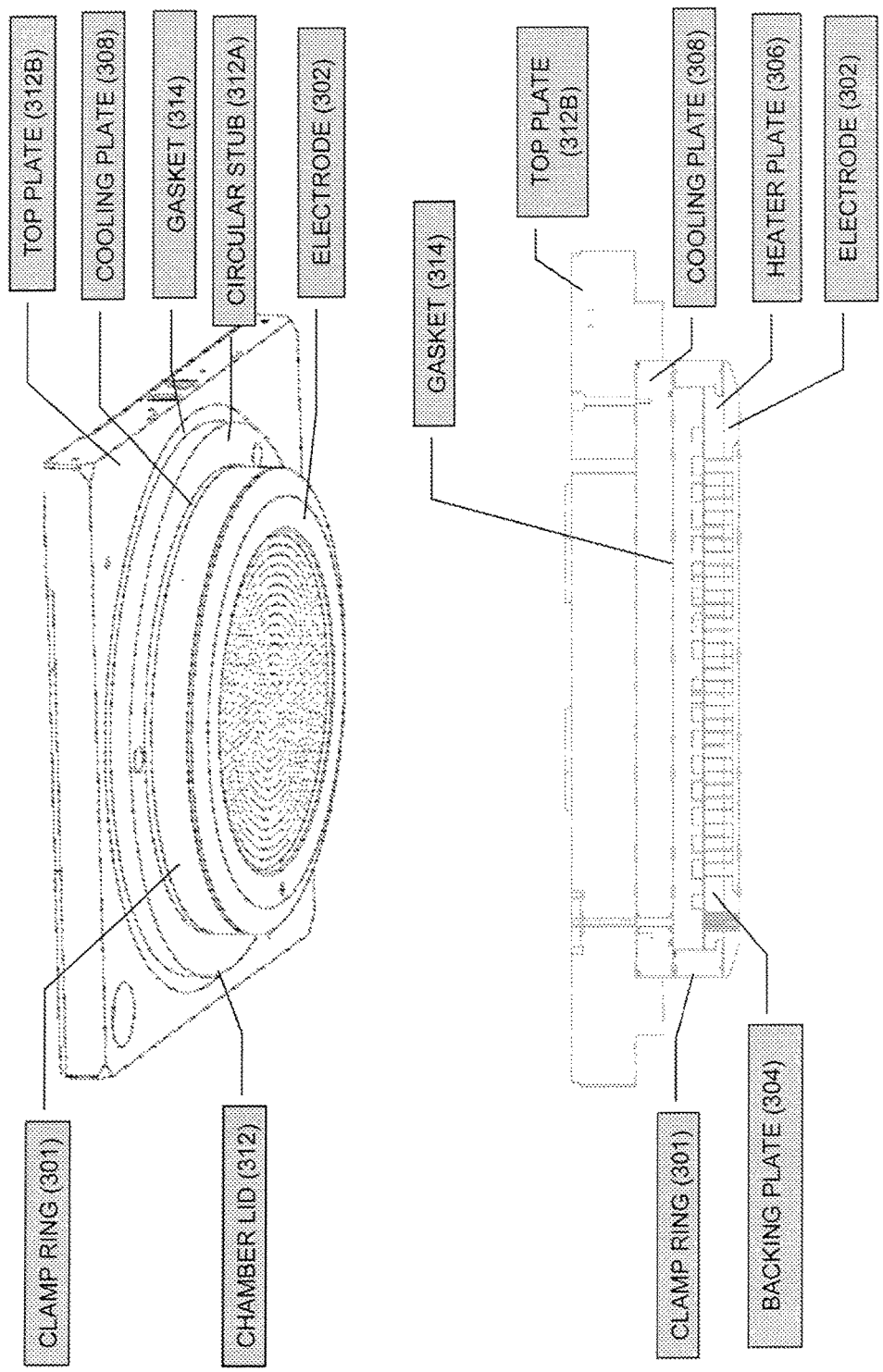
FIGS. 3A-C show a set of simplified diagrams of an electrode assembly with a clamp ring, according to an embodiment of the invention.
Figure 3B:
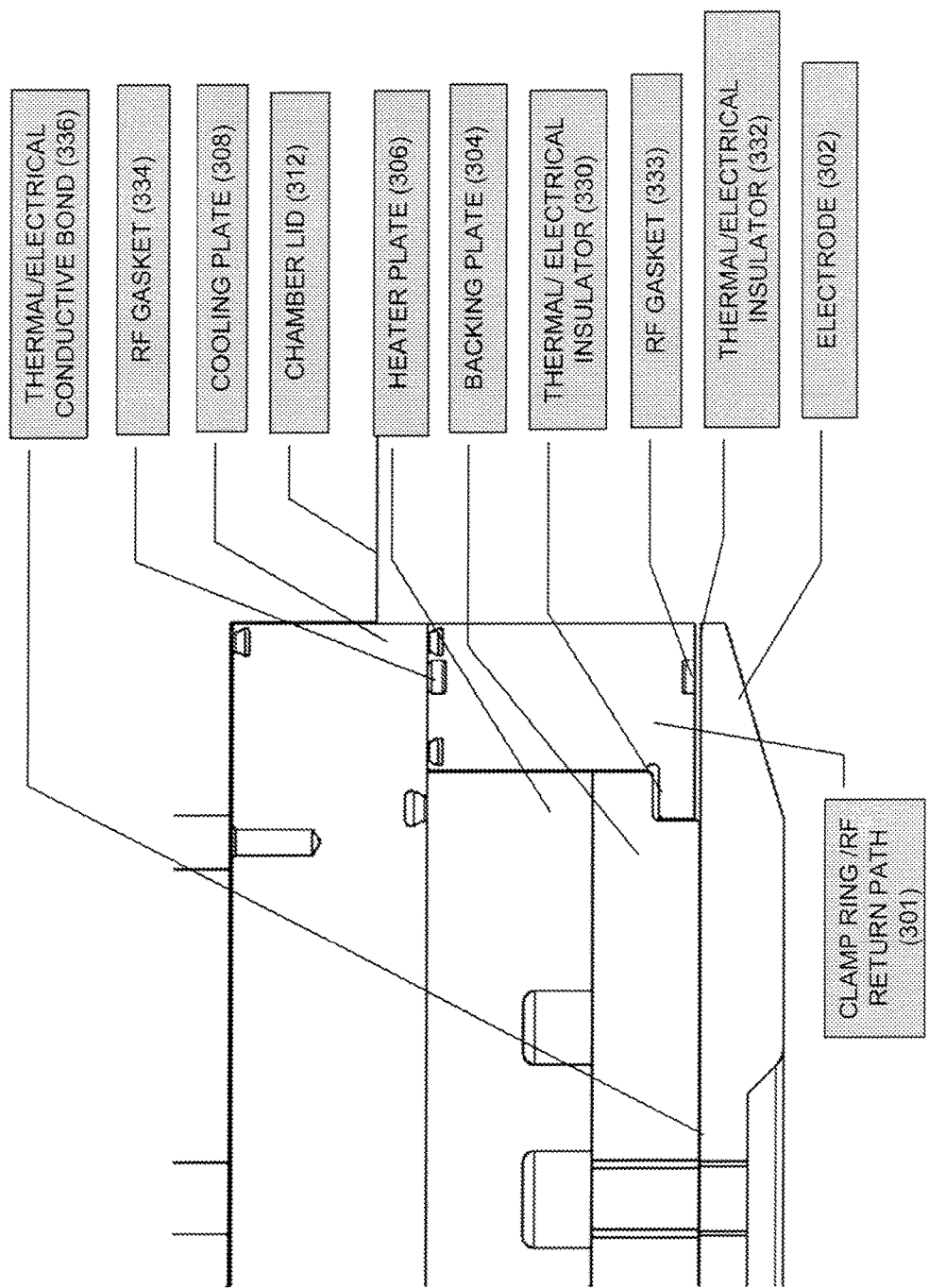
Figure 3C:
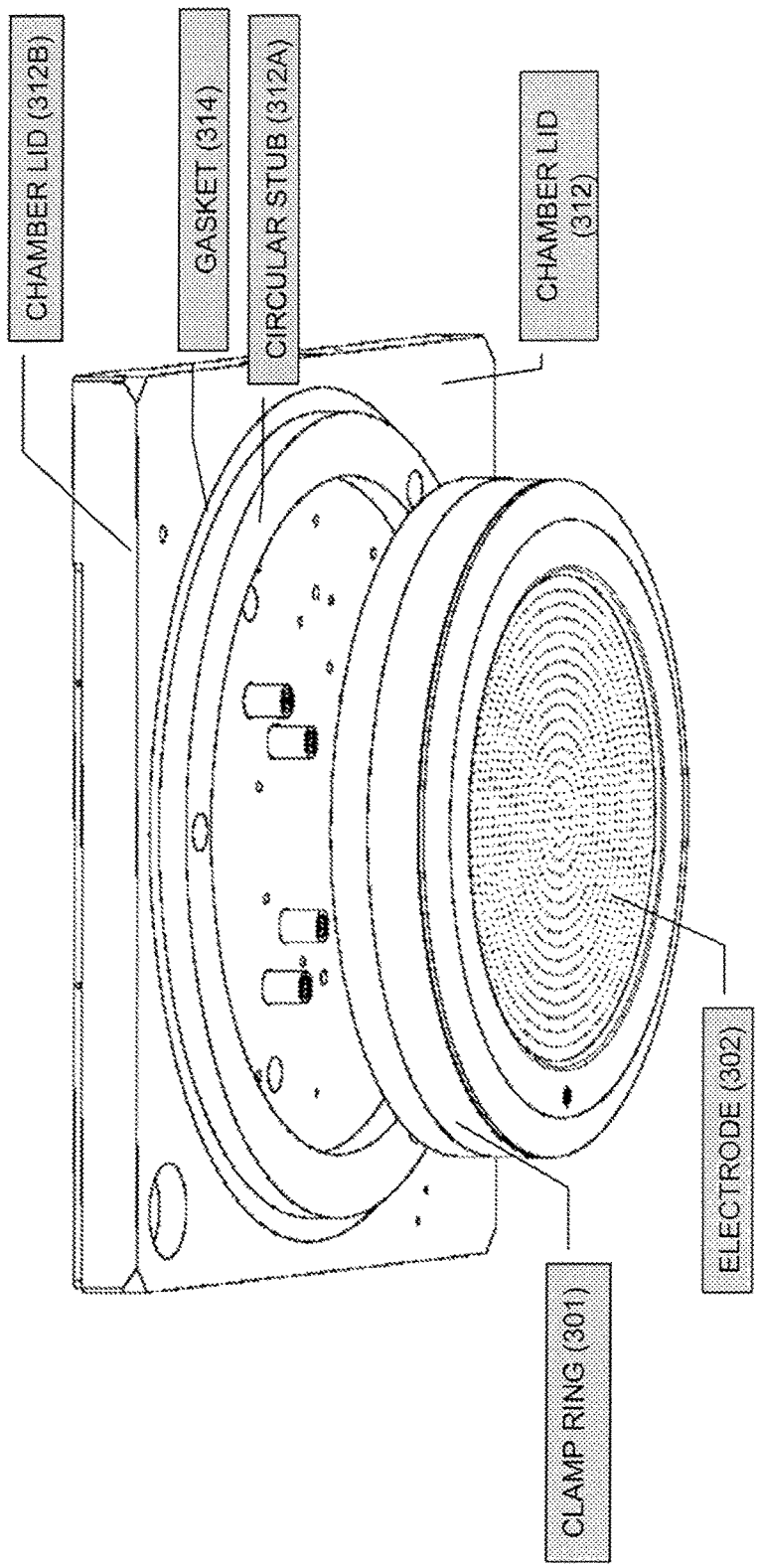

Referring now to FIG. 3A-C, a set of simplified diagrams of an electrode assembly with a clamp ring, according to an embodiment of the invention. FIG. 3A shows a lateral and isometric view of the electrode assembly, according to an embodiment of the invention. Chamber lid 312 is configured to mate with the plasma chamber in order to maintain a substantial vacuum for plasma processing. In general, chamber lid 312 comprises a top plate 312b and circular stub 312a that protrudes into the plasma chamber (not shown) and provides a planar surface to which a cooling plate 308 or heating plate 306 may be positioned. Circular stub 312a is further surrounded by a groove (defined by circular stub 312a and top plate 312b) into which gasket 314 are commonly placed.

In one configuration, cooling plate 308 is positioned below circular stub 312a. Below to cooling plate 308 is generally heating plate 306 which in combination allow the plasma gas temperature to be sustained within recipe parameters in order to generally maintain etch quality and substrate yield. Below heating plate 306 is backing plate 304. Commonly made of graphite, backing plate generally provides temperature uniformity across electrode 302.

However, in contrast to commonly used configurations, clamp ring 301 is secured to electrode 302, forming a pocket or bucket into which cooling plate 308, heater plate 306, and backing plate 304 may be placed. A pocket configuration allows greater amount lateral and longitudinal play, since metal fasteners are not needed to secure components (e.g., cooling plate, heating plate, backing plate, etc.) within the pocket. Consequently, repetitive cycling of temperature may produce substantially less stress and hence less damage the backing plate than more commonly used configurations. That is, the amount of contaminants (e.g., graphite particles, etc.) produced is minimized.

In an embodiment, clamp ring 301 may be secured to electrode 302 with a set of fasteners (e.g., bolts, screws, etc.). In an embodiment, clamp ring 301 and electrode 302 may be formed into a single unit. In an embodiment, the clamp ring 301 may be secured to electrode 302 in a tongue and groove configuration. That is, a tongue in one component extends into a groove in the other component. In an embodiment, clamp ring 301 may be welded to electrode 302. In an embodiment, clamp ring 301 may be bonded to electrode 302. In an embodiment, clamp ring 301 has a ledge that laterally extends towards the center of clamp ring 301, wherein electrode 302 sits on the lateral ledge.

Furthermore, reducing the number of fasteners also may make assembling, replacing, and/or installing the electrode assembly substantially easier. As previously described, after the electrode assembly has been repeatedly exposed to plasma and/or temperature cycling, the actual tolerance may be reduced. However, substantially reducing or eliminating metal fasteners, and hence the corresponding required helicoils in the graphite backing plate, may also reduce helicoil contamination and tolerance shrinkage within the fastener holes. In addition, since tolerance shrinkage has been minimized, the likelihood of damage to electrode components is also reduced. That is, the use of multiple tools (e.g., screwdriver, hammer, wedge, etc.) would not be required to dislodge the components.

In addition, the electrode sub-assembly (e.g., electrode, backing plate, heater plate, cooling plate, clamp ring, etc.) may be pre-assembled prior to installation at the plasma processing system, potentially reducing the installation time and hence the period of time that the plasma chamber is offline. Furthermore, clamp ring 301 may function as a dedicated RF return path along the outer surface of the electrode assembly within the plasma chamber, minimizing the effect of a shifting return path on the plasma load. As previously described, for a given process recipe, it may be beneficial for the RF power delivery remain stable throughout the process to obtain a reliable process result.

Referring now to FIG. 3B, a more detailed lateral view of the electrode assembly of FIG. 3A is shown, according to an embodiment of the invention. In addition to previously described components, additional elements are described. For example, between clamp ring 301 and backing plate 304, and between electrode 302 and clamp ring 301, a thermal insulator may be used (e.g., vacuum, ceramic, silicone elastomer etc.). Electrically, thermal/electrical insulator 330 and 332 both help electrically isolate clamp ring 301 from the remainder of the electrode assembly components, in order to get a clean and consistent RF return path as previously described. Thermally, thermal/electrical insulator 330 and 332 both help attenuate the heat transfer from the plasma chamber to the inside of the electrode assembly, minimizing any thermal expansion.

In contrast, a thermal/electrical conductive bond 336 may be used between clamp ring 301 and cooling plate 308 for the opposite reason. That is, thermal/electrical conductive bond 336 electrically couples clamp ring 301 to cooling plate 308 in order to complete the RF return path and insure an optimized ground. Thermally, thermal/electrical conductive bond 336 conducts heat from the plasma chamber, as well as the electrode assembly to cooling plate 308. Consequently, the generated heat may be removed from the electrode assembly by a fluid recalculating through cavities in within cooling plate 308 to a chiller system.

Referring now to FIG. 3C, a simplified isometric view of the electrode assembly of FIG. 3A is shown, in which the electrode assembly is being attached to the chamber lid, according to an embodiment of the invention. Unlike previous configurations, electrode sub-assembly components (e.g., cooling plate, heater plate, backing plate, etc.) may be quickly placed in a pocket formed by clamp ring 301 and electrode 302, and then quickly attached to chamber lid 312, once chiller connections (not shown) to cooling plate (not shown), and gas distribution connections 342 to the electrode assembly, are aligned.

Figure 4A:
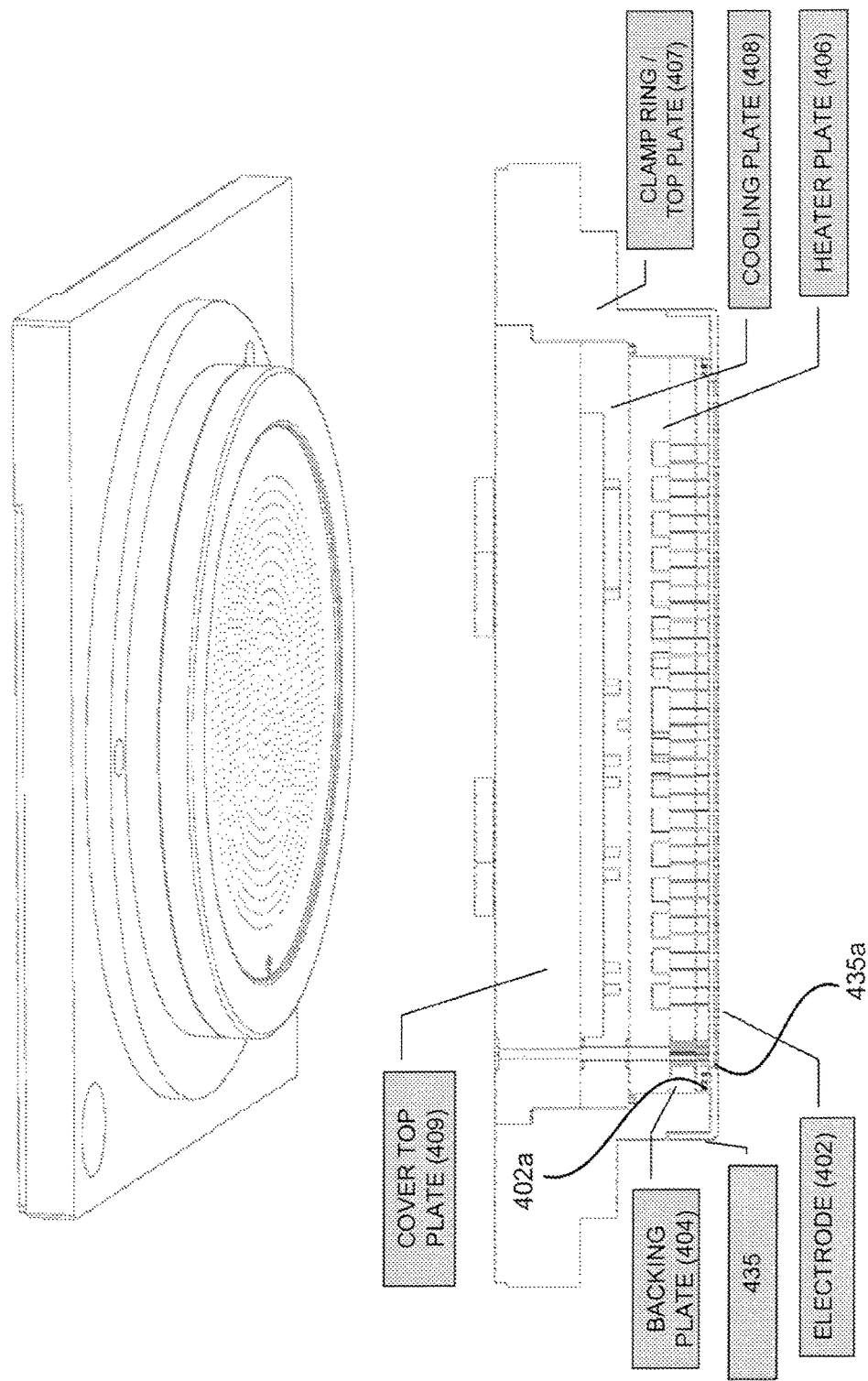
FIGS. 4A-C show a set of simplified diagrams of an electrode assembly in which a clamp ring is integrated into the chamber lid, according to an embodiment of the invention.
Figure 4B:
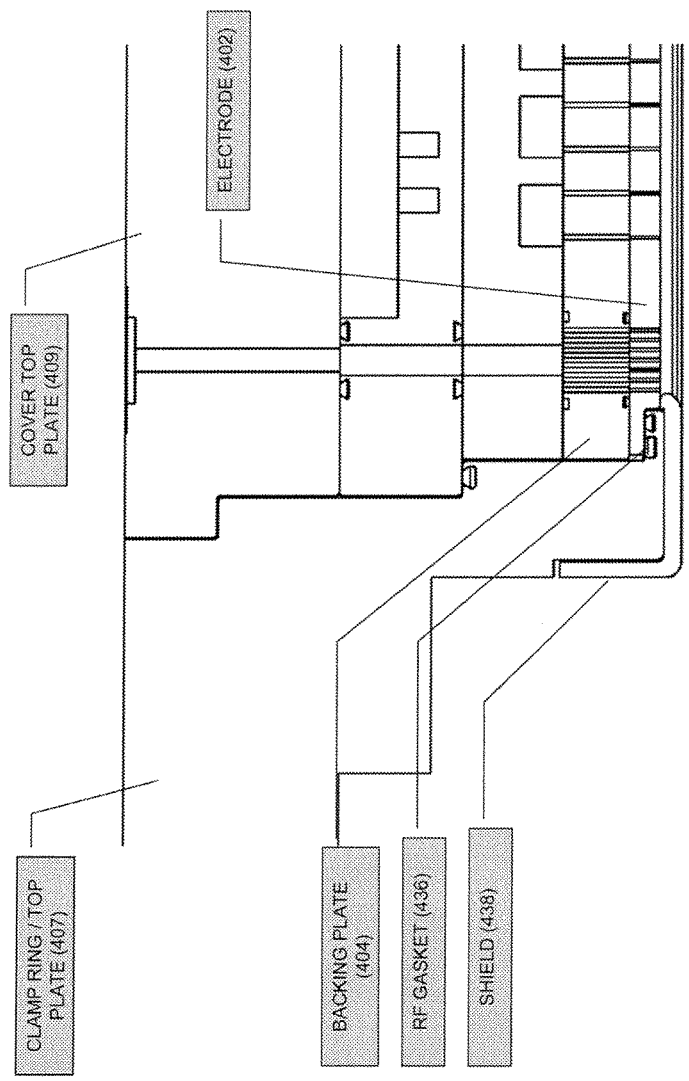
Figure 4C:
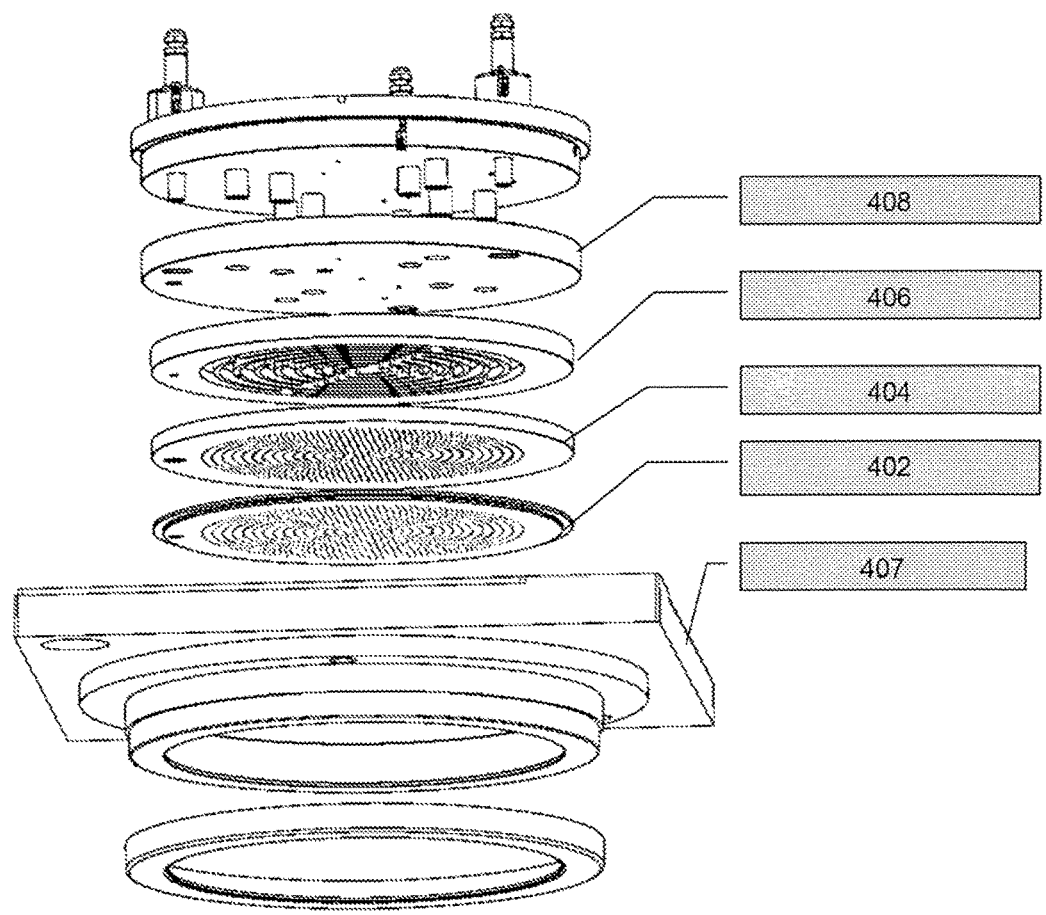

Referring now to FIG. 4A-C, a set of simplified diagrams of an electrode assembly in which a clamp ring is integrated into the chamber lid, according to an embodiment of the invention. In this configuration, the chamber lid is comprises of two components: clamp ring/top plate 407 and a cover top plate 409. Clamp ring/top plate 407 is configured to form a pocket in order to position the electrode sub-assembly components, as previously described, without having to further attach the sub-assembly itself to the chamber lid. That is, the clamp ring is integrated into the chamber lid. In addition, cover top plate 409 is configured to secure, and hence compress, the sub-assembly components for plasma chamber operation, as well as to insure that proper chamber pressure is maintained.

FIG. 4A shows a lateral and isometric view of the electrode assembly, according to an embodiment of the invention. In an embodiment, clamp ring/top plate 407 may be tiered or stepped to secure electrode components (e.g., cooling plate 408, heater plate 406, backing plate 404, electrode 402, etc.) without the use of metal fasteners. In addition, an annular overhang of the electrode 402 may sit on an annular ledge of clamp 435, which annular ledge extends laterally toward the center to support the annular overhang of electrode 402.

Electrode sub-assembly components may then be compressed into the pocket by attaching cover top plate 409 to clamp ring/top plate 407. In an embodiment, cover top plate 409 is secured to clamp ring/top plate 407 with a set of fasteners. In an embodiment, cover top plate 409 is secured to clamp ring/top plate 407 with a set of threads, such that it may itself be torqued into clamp ring/top plate 407. As previously described, the pocket construction may allow a greater amount lateral and longitudinal play than in most commonly used configurations, since metal fasteners are not needed to secure electrode sub-assembly components (e.g., cooling plate, heating plate, backing plate, etc.) within the pocket. Consequently, repetitive cycling of temperature may produce substantially less stress and hence less damage the backing plate than more commonly used configurations. That is, the amount of contaminants (e.g., graphite particles, etc.) produced is minimized.

Referring now to FIG. 4B, a more detailed lateral view of the electrode assembly of FIG. 4A is shown, according to an embodiment of the invention. In addition to previously described components, additional elements are described. For example, an annular protecting shield 438 is positioned, such that a lateral ledge extends toward the center and overlaps the seam (as seen from below, i.e., from the plasma cloud) between the annular ledge of clamp ring/top plate 407 and electrode 402. This overlapping may shield the seam from plasma exposure, substantially reducing the amount of plasma species that may seep into the seam and potentially damage components of the electrode assembly. In an embodiment, shield 438 comprises SiC or silicon carbide. In addition RF gasket 436 and o-ring seal may be placed between a top surface of clamp ring/top plate 407 and a bottom surface electrode 402 in order to optimize the RF return path through clamp ring/top plate 407.

Referring now to FIG. 4C, a simplified isometric view of the electrode assembly of FIG. 4A is shown, in which the electrode assembly is being assembled, according to an embodiment of the invention. Unlike previous configurations, electrode sub-assembly components (e.g., cooling plate, heater plate, backing plate, etc.) may be quickly placed in a tiered or stepped pocket formed by clamp ring/top plate 407 once chiller connections (not shown) to cooling plate 408, and gas distribution connections (not shown) to the electrode assembly, are aligned.

While this invention has been described in terms of several preferred embodiments, there are alterations, permutations, and equivalents which fall within the scope of this invention. For example, although the present invention has been described in connection with plasma processing systems from Lam Research Corp. (e.g., Exelan™, Exelan™ HP, Exelan™ HPT, 2300™, Versys™ Star, etc.), other plasma processing systems may be used (e.g., atmospheric plasma processing system, low-pressure plasma processing system, inductively coupled plasma processing system, capacitively coupled plasma processing system, etc.). In addition, the term "above" as used herein does not require a direct contact between the components disposed "above" one another. This invention may also be used with substrates of various diameters (e.g., 200 mm, 300 mm, etc.), as well as in systems in which the top electrode is powered. Furthermore, the term set as used herein includes one or more of the named element of the set. For example, a set of "X" refers to one or more "X."

Advantages of the invention include an apparatus for an optimized plasma chamber electrode. Additional advantages may include a consistent RF return path to ground, ease of manufacture, assembly, and installation, substantial reduction in the use of metal fasteners, reduction in the likelihood of arcing, and the ability to preassemble the electrode sub-assembly prior to arrival at a plasma chamber.

Having disclosed exemplary embodiments and the best mode, modifications and variations may be made to the disclosed embodiments while remaining within the subject and spirit of the invention as defined by the following claims.

What is claimed is:

1. An upper electrode for use in a plasma processing chamber comprising:
   an upper electrode assembly configured to provide a ground path for the plasma processing chamber, wherein the upper electrode assembly includes an electrode configured to be exposed to a set of gases and provides conduits for injecting the set of gases into the plasma processing chamber, the upper electrode assembly includes,
   the electrode configured to be exposed to a plasma;
   a heater plate disposed above said electrode, wherein said heater plate is configured to heat said electrode;
   a backing plate disposed between the electrode and the heater plate, wherein the backing plate is configured to electrically isolate the electrode from the heating plate;
   a cooling plate disposed above and in contact with said heater plate, wherein said cooling plate is configured to cool said electrode;
   a plasma chamber lid configured to confine the plasma in the plasma chamber, wherein the plasma chamber lid includes, a ground and a clamp ring configured to connect the electrode to the plasma chamber lid, and a pocket formed by contacting together the clamp ring, an RF conductive gasket, and the electrode; and
   an annular shield covering a bottom surface of the clamp ring, the annular shield including a lateral ledge that overlaps at a seam between the clamp ring and the electrode.

2. The upper electrode of claim 1, wherein the RF conductive gasket is disposed between the clamp ring and the electrode to form an arrangement for an optimized RF return path to ground.

3. The upper electrode of claim 2, wherein the pocket comprises a space for receiving the backing plate over the electrode, the heater plate over the backing plate, and the cooling plate over the heater plate.

4. The upper electrode of claim 3, wherein no metal fasteners are used to couple together any one of the backing plate to the heater plate and the heater plate to the cooling plate when disposed in the space of the pocket.

5. The upper electrode of claim 1, wherein the plasma processing chamber includes a lower electrode assembly configured to provide power to the plasma processing chamber to generate plasma from the set of gases disposed therein, wherein the lower electrode assembly includes a powered electrode configured to receive power from a set of (RF) generators positioned outside the plasma processing chamber and to provide power to the plasma processing chamber.

6. The upper electrode of claim 5, wherein the plasma processing chamber is configured as a component of plasma processing system defined to be one of an atmospheric plasma processing system, a low-pressure plasma processing system, an inductively coupled plasma processing system or a capacitively coupled plasma processing system.

7. The upper electrode of claim 1, wherein the upper electrode assembly comprises a showerhead.

8. The upper electrode of claim 1, wherein the pocket of the upper electrode assembly comprises a configuration to allow longitudinal and lateral tolerances for thermal expansion of said set of components from repetitive thermal cycling.

9. The upper electrode of claim 1, wherein the plasma chamber lid of the upper electrode assembly comprises:
   a top plate;
   a top cover; and
   a plurality of fasteners;
   wherein the top plate comprises the integral clamp ring,
   wherein the plurality of fasteners couple the top plate to the top cover.

10. The upper electrode of claim 9, wherein the top cover and electrode sub-assembly components disposed in the pocket of the upper electrode assembly comprise configurations to facilitate insertion or removal of electrode sub-assembly components from the pocket of the upper electrode assembly.

11. An upper electrode assembly configured to provide a ground path for a plasma processing chamber, the upper electrode assembly comprising,
   an electrode configured to be exposed to a plasma when generated in the plasma processing chamber;
   a heater plate disposed above said electrode, wherein said heater plate is configured to heat said electrode;
   a backing plate disposed between the electrode and the heater plate, wherein the backing plate is configured to substantially electrically isolate the electrode from the heating plate;
   a cooling plate disposed above and in contact with said heater plate, wherein said cooling plate is configured to cool said electrode;
   a plasma chamber lid configured to enclose the plasma processing chamber, wherein the plasma chamber lid includes a ground connection and a clamp ring configured to secure the electrode to the plasma chamber lid, wherein a pocket formed by contacting together the clamp ring, an RF conductive gasket, and the electrode; and
   an annular shield covering a portion of a bottom surface of the clamp ring, the annular shield including a lateral ledge that overlaps at a seam between the clamp ring and the electrode.

12. The upper electrode of claim 11, wherein the RF conductive gasket is disposed between the clamp ring and the electrode to form an RF return path to ground when in operation.

13. The upper electrode of claim 12, wherein the pocket comprises a space for receiving the backing plate over the electrode, the heater plate over the backing plate, and the cooling plate over the heater plate.

14. The upper electrode of claim 13, wherein no metal fasteners are used to couple together any one of the backing plate to the heater plate and the heater plate to the cooling plate when disposed in the space of the pocket.

15. The upper electrode of claim 13, wherein the plasma processing chamber includes a lower electrode assembly configured to provide power to the plasma processing chamber to generate the plasma from a set of gases.

16. The upper electrode of claim 15, wherein the lower electrode assembly includes a powered electrode configured to receive power from at least one (RF) generator.

17. The upper electrode of claim 16, wherein the at least one RF generator is positioned outside the plasma processing chamber.

18. The upper electrode of claim 11, wherein the plasma chamber lid of the upper electrode assembly comprises:
 a top plate;
 a top cover; and
 a plurality of fasteners;
 wherein the top plate comprises the integral clamp ring,
 wherein the plurality of fasteners couple the top plate to the top cover.

\* \* \* \* \*